United States Patent
Tanaka et al.

(10) Patent No.: US 7,061,067 B2
(45) Date of Patent: Jun. 13, 2006

(54) SCHOTTKY BARRIER DIODE

(75) Inventors: Yuji Tanaka, Takatsuki (JP); Naotoshi Kashima, Kyoto (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 65 days.

(21) Appl. No.: 10/875,350

(22) Filed: Jun. 24, 2004

(65) Prior Publication Data
US 2005/0029615 A1 Feb. 10, 2005

(30) Foreign Application Priority Data
Jul. 4, 2003 (JP) .............................. 2003-191953

(51) Int. Cl.
*H01L 27/095* (2006.01)
(52) U.S. Cl. ..................... 257/484; 257/485
(58) Field of Classification Search ................ 257/484, 257/485, 453
See application file for complete search history.

(56) References Cited

U.S. PATENT DOCUMENTS
4,206,540 A * 6/1980 Gould .................... 438/570

FOREIGN PATENT DOCUMENTS
JP 11-330498 11/1999

* cited by examiner

*Primary Examiner*—David Nelms
*Assistant Examiner*—Thinh T Nguyen

(57) ABSTRACT

To reduce a reverse leakage current in a Schottky barrier diode with achieving a lower forward voltage Vf and a smaller capacitance than in the related art, a Schottky barrier diode includes a semiconductor layer of a first conductivity type, a first electrode which is a metal layer forming a Schottky contact with a main surface of the semiconductor layer, a second electrode forming an ohmic contact with an opposite main surface of the semiconductor layer, a buried layer of a second conductivity type formed within the semiconductor layer so as not to be in contact with the first electrode, where the second conductivity type has a different charge carrier from the first conductivity type, and a guard ring of the second conductivity type formed within the semiconductor layer so as to be in contact with the first electrode and also to surround the buried layer without contacting with the buried layer.

7 Claims, 17 Drawing Sheets

SCHOTTKY BARRIER DIODE

BACKGROUND OF THE INVENTION

(1) Field of the Invention

The present invention relates to a Schottky barrier diode. The present invention especially relates to a low-loss Schottky barrier diode which achieves a lower forward voltage Vf and a smaller capacitance, without an increase in a reverse leakage current.

(2) Prior Art

In recent years, Schottky barrier diodes are widely used as rectifying elements in electronic products in order to achieve lower power consumption and higher speed. Schottky barrier diodes have a lower forward voltage Vf and a smaller capacitance than general pn-junction diodes.

A forward voltage Vf of a Schottky barrier diode decreases as a barrier height is lowered. However, a decrease in Schottky barrier height causes a problem that reverse currents that are generated when a reverse bias is applied, i.e. a leakage current, increase.

To solve this problem, unexamined Japanese patent application publication No. H11-330498 discloses a Schottky barrier diode (herein after referred to as a conventional Schottky barrier diode).

This conventional Schottky barrier diode has the following constitution. A metal anode electrode is provided on a surface of a semiconductor layer of a first conductivity type, so as to form a Schottky contact. An ohmic cathode electrode is provided on an opposite surface of the semiconductor layer of the first conductivity type. Semiconductor layers of a second conductivity type are buried within the semiconductor layer of the first conductivity type, at such intervals that depletion layers formed at interface regions between the buried layers and the semiconductor layer connect with one another when a reverse bias is applied. The semiconductor layers of the second conductivity type (hereinafter referred to as buried layers) are at the same potential as the anode electrode forming the Schottky contact.

According to the above construction, the buried layers formed within the semiconductor layer of the first conductivity type are at the same potential as the anode electrode. Therefore, when a reverse bias is applied, depletion layers formed at interface regions between the buried layers and the semiconductor layer of the first conductivity type expand. The expansion of the depletion layers reduces a leakage current.

However, since the buried layers are buried within the semiconductor layer of the first conductivity type, a passage area for carriers that cross a Schottky contact barrier when a forward voltage is applied decreases. This causes a resistance to be generated, and therefore causes a forward voltage Vf of the above-mentioned conventional Schottky barrier diode to increase.

Furthermore, a speed of a switching operation is decreased by a capacitance of the depletion layers formed at interface regions between the buried layers at the same potential as the anode electrode and the semiconductor layer of the first conductivity type at the same potential as the cathode electrode.

SUMMARY OF THE INVENTION

The object of the present invention is to provide a Schottky barrier diode which achieves a lower forward voltage Vf and a smaller capacitance than the above-mentioned conventional Schottky barrier diode, without an increase in a reverse leakage current, and a manufacturing method for the same.

The above object can be achieved by a Schottky barrier diode including a semiconductor layer of a first conductivity type, a first electrode which is a metal layer forming a Schottky contact with a main surface of the semiconductor layer, a second electrode forming an ohmic contact with an opposite main surface of the semiconductor layer, a buried layer of a second conductivity type formed within the semiconductor layer so as not to be in contact with the first electrode, where the second conductivity type has a different charge carrier from the first conductivity type, and a guard ring of the second conductivity type formed within the semiconductor layer so as to be in contact with the first electrode and also to surround the buried layer without contacting with the buried layer.

According to the Schottky barrier diode with the above-mentioned construction, the buried layer is formed so as to be surrounded by the guard ring, without being in contact with the guard ring. Thus, the area of the buried layer is smaller than in the above-mentioned conventional Schottky barrier diode, thereby reducing a resistance. As a result, the Schottky barrier diode having the above-mentioned construction has a lower forward voltage Vf than the above-mentioned conventional Schottky barrier diode.

The buried layer is not in contact with the guard ring. Accordingly, the area of the semiconductor layer of the second conductivity type which is at an equal potential to the first electrode is smaller than in the above-mentioned conventional Schottky barrier diode. Consequently, the capacitance between the first and second electrodes can be made smaller.

In addition, when a reverse bias is applied, a depletion layer formed at an interface region between the guard ring at the same potential as the first electrode and the semiconductor layer of the first conductivity type expands. This depletion layer eventually connects with a depletion layer which is formed at an interface region between the buried layer and the semiconductor layer of the first conductivity type. Thus, the region surrounded by the guard ring is occupied by the depletion layers. The depletion layers can stop the movement of carriers caused by application of a reverse bias. As a consequence, a leakage current can be reduced.

Here, the buried layer may be constituted by a plurality of members which are separated from each other. The plurality of members may be strip-shaped, and arranged at substantially even intervals, so as to be adjacent to each other in a direction perpendicular to a lengthwise direction of the members.

According to this construction, the area of the buried layer can be further decreased.

Here, the semiconductor layer may include a substrate having a high concentration of impurities and an epitaxial layer having a low concentration of impurities, and the guard ring and the buried layer may be each made of a semiconductor of the second conductivity type having a high concentration of impurities, and may be formed within the epitaxial layer.

This construction increases the expansion of the depletion layer of positive ions in the epitaxial layer having a low concentration of impurities.

Here, the first conductivity type may be an n type, and the second conductivity type may be a p type.

The object can be also achieved by a Schottky barrier diode including a semiconductor layer of a first conductivity type, a first electrode which is a metal layer forming a Schottky contact with a main surface of the semiconductor layer, a second electrode forming an ohmic contact with an opposite surface of the semiconductor layer, a first buried layer of a second conductivity type formed within the semiconductor layer so as not to be in contact with the first electrode, where the second conductivity type has a different charge carrier from the first conductivity type, a second buried layer of the second conductivity type formed within the semiconductor layer so as to surround the first buried layer without contacting with the first electrode and the first buried layer, and a guard ring of the second conductivity type formed within the semiconductor layer so as to surround the second buried layer with being in contact with the first electrode and the second buried layer.

According to the Schottky barrier diode with the above-mentioned construction, the first buried layer is formed so as to be surrounded by the guard ring and the second buried layer, without being in contact with the guard ring and the second buried layer. Thus, the total area of the first and second buried layers is smaller than in the above-mentioned conventional Schottky barrier diode. This reduces a resistance, and therefore achieves a lower forward voltage Vf than in the above-mentioned conventional Schottky barrier diode.

Since the first buried layer is not in contact with the guard ring, the total area of the semiconductor layers of the second conductivity type which are at an equal potential to the first electrode is smaller, when compared with the above-mentioned conventional Schottky barrier diode. This achieves a smaller capacitance between the first and second electrodes than in the above-mentioned conventional Schottky barrier diode.

Furthermore, when a reverse bias is applied, a depletion layer formed at an interface region between (i) the guard ring and the second buried layer at the same potential as the first electrode and (ii) the semiconductor layer of the first conductivity type expand. The depletion layer eventually connects with a depletion layer formed at an interface region between the first buried layer and the semiconductor layer of the first conductivity type. Thus, the region surrounded by the guard ring is occupied by the depletion layers, which stop the movement of carriers caused by application of a reverse bias. As a consequence, a leakage current is reduced.

Here, the first buried layer may be constituted by a plurality of members which are separated from each other, and the second buried layer may be formed like a ring. The plurality of members may be strip-shaped, and arranged at substantially even intervals, so as to be adjacent to each other in a direction perpendicular to a lengthwise direction of the members.

According to this construction, the total area of the first and second buried layers can be further reduced.

Here, the semiconductor layer may include a substrate having a high concentration of impurities and an epitaxial layer having a low concentration of impurities, and the first buried layer, the second buried layer, and the guard ring may be each made of a semiconductor of the second conductivity type having a high concentration of impurities, and may be formed within the epitaxial layer.

This construction increases the expansion of the depletion layer of positive ions in the epitaxial layer having a low concentration of impurities.

The object can be also achieved by a manufacturing method of a Schottky barrier diode including (i) a first electrode which is a metal layer forming a Schottky contact with a first surface of a semiconductor layer of a first conductivity type and (ii) a second electrode forming an ohmic contact with a second surface of the semiconductor layer. The manufacturing method includes a guard ring formation step of forming a ring-like guard ring of a second conductivity type within the semiconductor layer, so that a part of the guard ring is exposed on the first surface of the semiconductor layer, where the second conductivity type has a different charge carrier from the first conductivity type, a buried layer formation step of burying a first buried layer of the second conductivity type within the semiconductor layer so as to be surrounded by the guard ring without being in contact with the guard ring, and a first electrode formation step of forming the first electrode so as to be in contact with the exposed part of the guard ring.

Here, in the buried layer formation step, a second buried layer of the second conductivity type may be formed so as to surround the first buried layer with being in contact with the guard ring.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 14 illustrates a planar shape of a buried layer relating to a modification example 2 and that of the buried layer 13a;

FIG. 15 illustrates a planar shape of a buried layer relating to a modification example 3 and that of the buried layer 13a;

FIG. 16 illustrates a planar shape of a buried layer relating to a modification example 4 and that of the buried layer 13a.

DESCRIPTION OF THE PREFERRED EMBODIMENT

Figure 1:
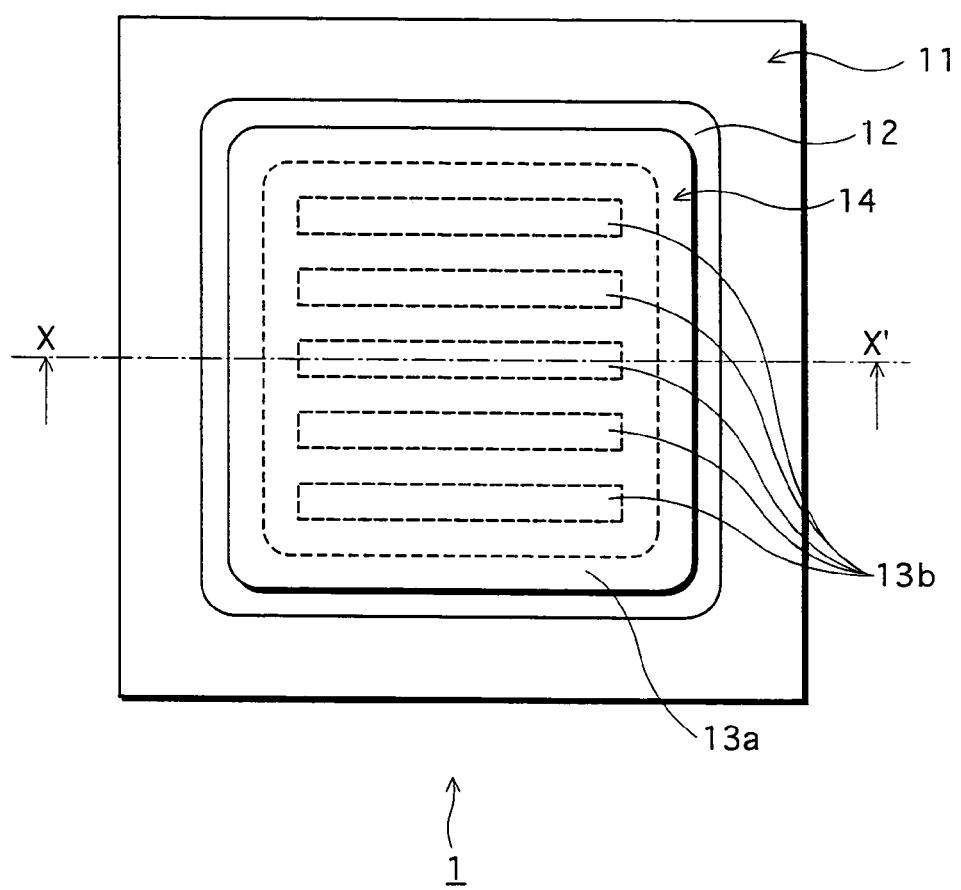
FIG. 1 is a plan view illustrating a Schottky barrier diode relating to an embodiment of the present invention, as viewed from an anode-electrode side.

The following part describes an embodiment of the present invention with reference to the attached figures.

It should be noted that the same reference numerals are used to indicate the same constituents in any of the figures.

(Construction)

Figure 2:
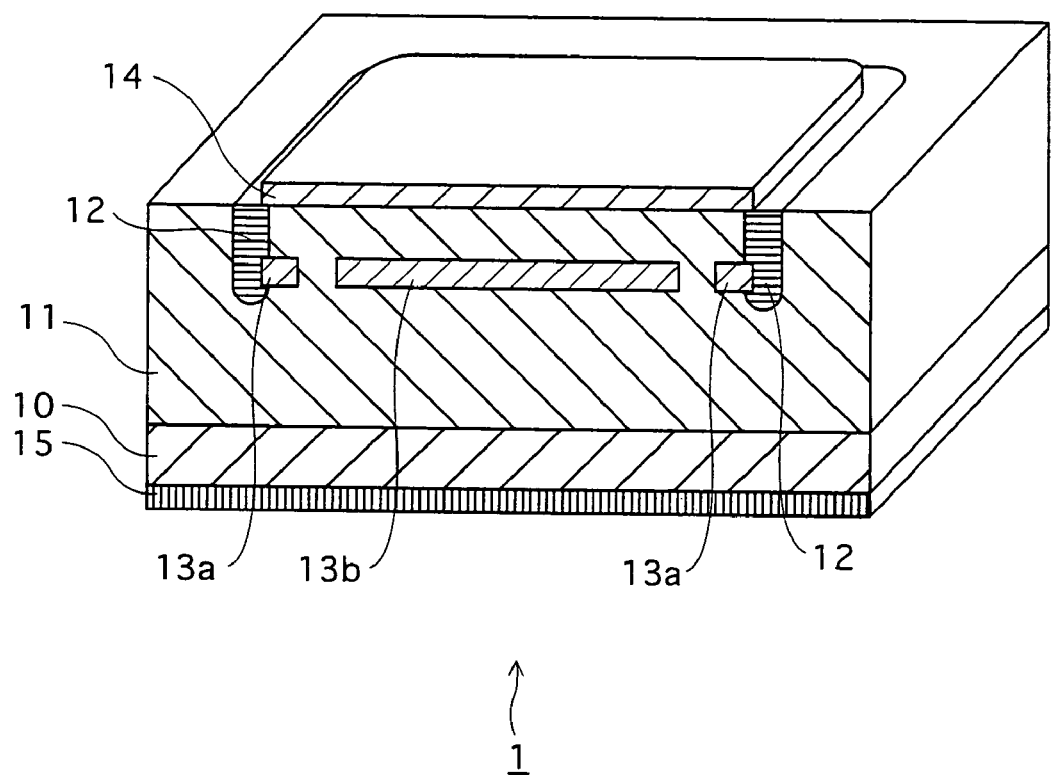
FIG. 2 is a perspective view illustrating a vertical cross section of the Schottky barrier diode along a line X–X' shown in FIG. 1.

FIG. 1 is a plan view illustrating a Schottky barrier diode relating to an embodiment of the present invention, as viewed from an anode-electrode side. FIG. 2 is a perspective view illustrating a vertical cross section, along a line X–X' shown in FIG. 1, of the Schottky barrier diode.

A Schottky barrier diode 1 shown in FIGS. 1 and 2 is constituted by a cathode electrode 15, an n+ substrate 10, an n epitaxial layer 11, a guard ring 12, a buried layer 13a, a buried layer 13b, and an anode electrode 14.

The n+ substrate 10 is made of n-type silicon (Si) having a high concentration of donor impurities. The n epitaxial layer 11 is made of n-type Si with a low concentration of donor impurities, which is precipitated on the n+ substrate 10.

The guard ring 12 and the buried layers 13a and 13b are formed within the n epitaxial layer 11. The anode electrode 14 made of titan (Ti) and silver (Ag) is placed on a surface of the n epitaxial layer 11, to form a Schottky contact. The cathode electrode 15 made of Ag is placed on an opposite surface of the n+ substrate 10, to form an ohmic contact.

The guard ring 12 is made of p-type Si having a high concentration of acceptor impurities, and formed as a ring. The guard ring 12 is ring-shaped to protect periphery portion of a Schottky-contact interface between the anode electrode 14 and the n epitaxial layer 11, since an electric current density of the periphery portion tends to be high. Also, the guard ring 12 has a function of suppressing degradation in reverse property. The guard ring 12 is in contact with the anode electrode 14, and so has an equal potential to the anode electrode 14.

The buried layers 13a and 13b are made of p-type Si having a high concentration of acceptor impurities. The planar shapes of the buried layers 13a and 13b, as viewed from the anode-electrode side, are shown by dotted lines in FIG. 1.

Figure 3:
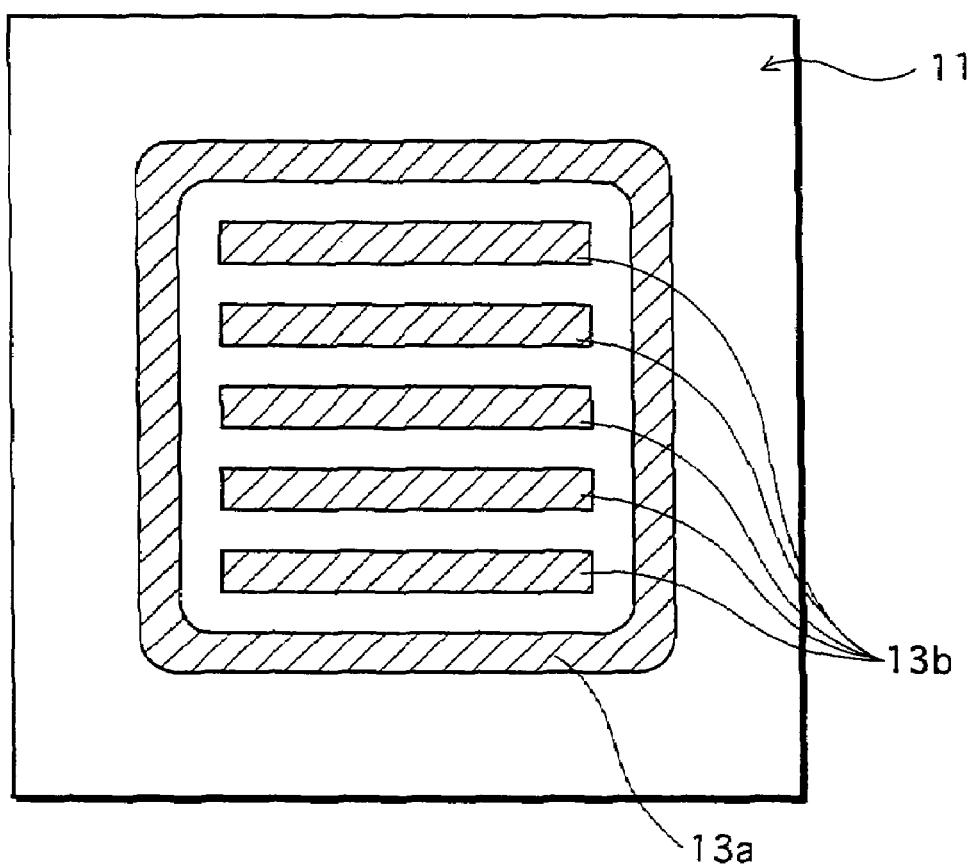
FIG. 3 illustrates planar shapes of buried layers (shown in FIG. 1)

FIG. 3 illustrates the planer shapes of the buried layers 13a and 13b, which are shown by dotted lines in FIG. 1.

As shown in FIG. 3, the buried layer 13a is formed like a ring. Carriers move in a direction perpendicular to the buried layer 13a, in the region surrounded by the ring-like buried layer 13a. As shown in FIG. 2, the buried layer 13a is not in contact with the anode electrode 14, but in contact with the guard ring 12. Accordingly, the buried layer 13a is at the same potential as the anode electrode 14.

The buried layer 13b is constituted by a plurality of members which are separated from each other as shown in FIG. 3. The buried layer 13b is formed so as to be surrounded by the ring-like buried layer 13a. The members constituting the buried layer 13b are strip-shaped, and are arranged so as to be adjacent to each other in a direction perpendicular to their lengthwise direction at substantially even intervals.

As the buried layer 13b is in contact with neither the guard ring 12 nor the anode electrode 14, the buried layer 13b is not at the same potential as the anode electrode 14.

A distance between the buried layer 13a and the buried layer 13b is determined in accordance with the degree of expansion of a depletion layer formed at a pn-junction region when a reverse bias is applied, the capability of the Schottky barrier diode 1 to withstand a pressure, and the conductance of the Schottky barrier diode 1.

(Effects of Application of Reverse Bias)

The following part specifically describes the expansion of a depletion layer at a pn-junction region in the Schottky barrier diode 1 when a reverse bias is applied.

Figure 4:
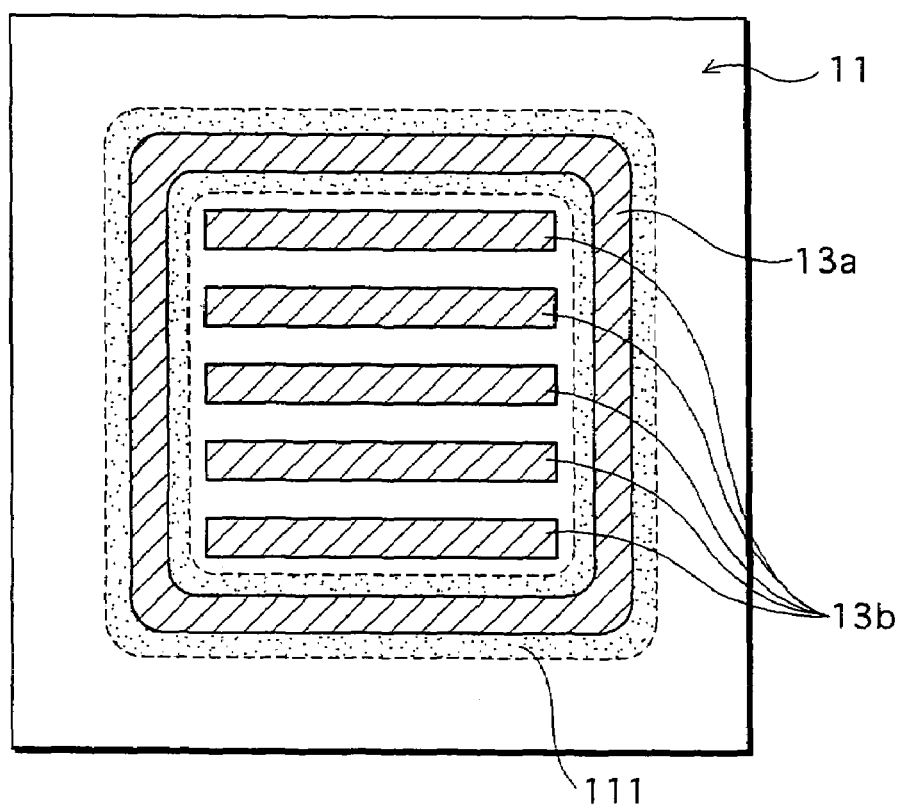
FIG. 4 is a plan view illustrating a depletion layer, which expands in an n epitaxial layer (shown in FIG. 1) when a reverse bias is applied.

FIG. 4 illustrates a depletion layer 111 of positive ions that expands in the n epitaxial layer 11 when a reverse bias is applied.

A depletion layer of negative ions expands within the guard ring 12 and the buried layer 13a too, though not illustrated in FIG. 4.

Since a depletion layer is electrically neutral, it tends to expand more in the n epitaxial layer 11 having a low concentration of impurities than in the guard ring 12 and the buried layer 13a having a high concentration of impurities. As a reverse bias increases, the depletion layer 111 further expands.

Figure 5:
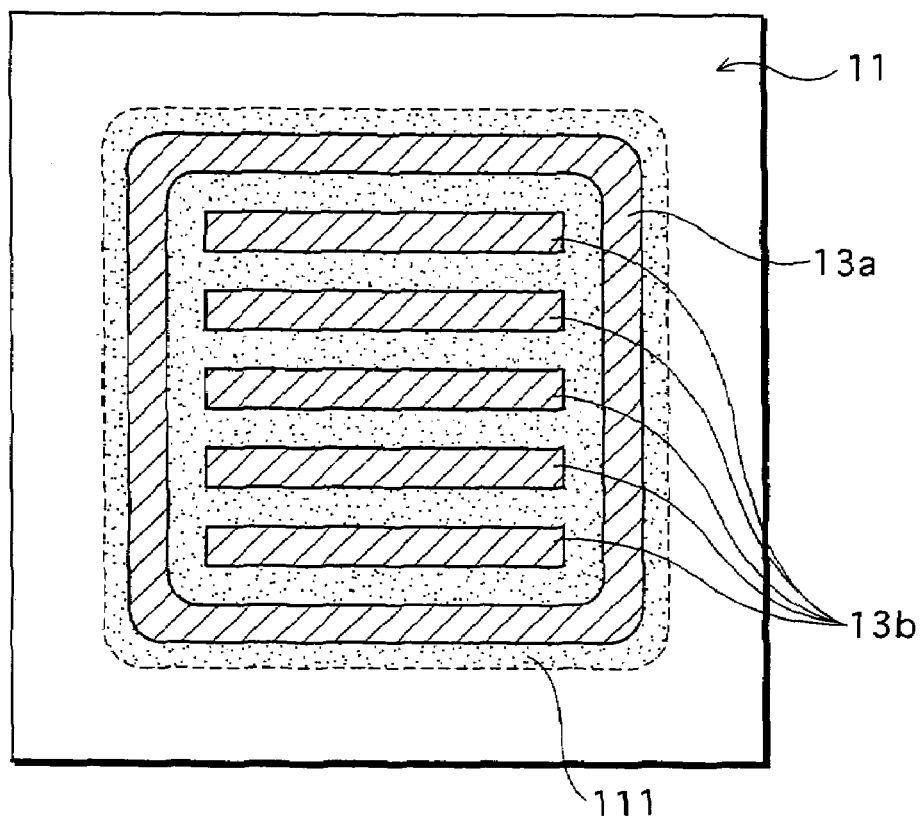
FIG. 5 is a plan view illustrating the depletion layer which has expanded in the entire n epitaxial layer inside the buried layer 13a when a reverse bias is applied.

The expanding depletion layer 111 eventually connects with a depletion layer formed at an interface region between the buried layer 13b and the n epitaxial layer 11. As a result, a region surrounded by the buried layer 13a in the n epitaxial layer 11 is occupied by the depletion layer 111 as shown in FIG. 5. This stops the movement of carriers when a reverse bias is applied. In other words, a reverse leakage current can be reduced.

(Comparison with the Conventional Schottky Barrier Diode)

The following part describes a planar shape of a buried layer of the above-mentioned conventional Schottky barrier diode disclosed in unexamined Japanese patent application publication H11-330498 as a comparative example.

Figure 17:
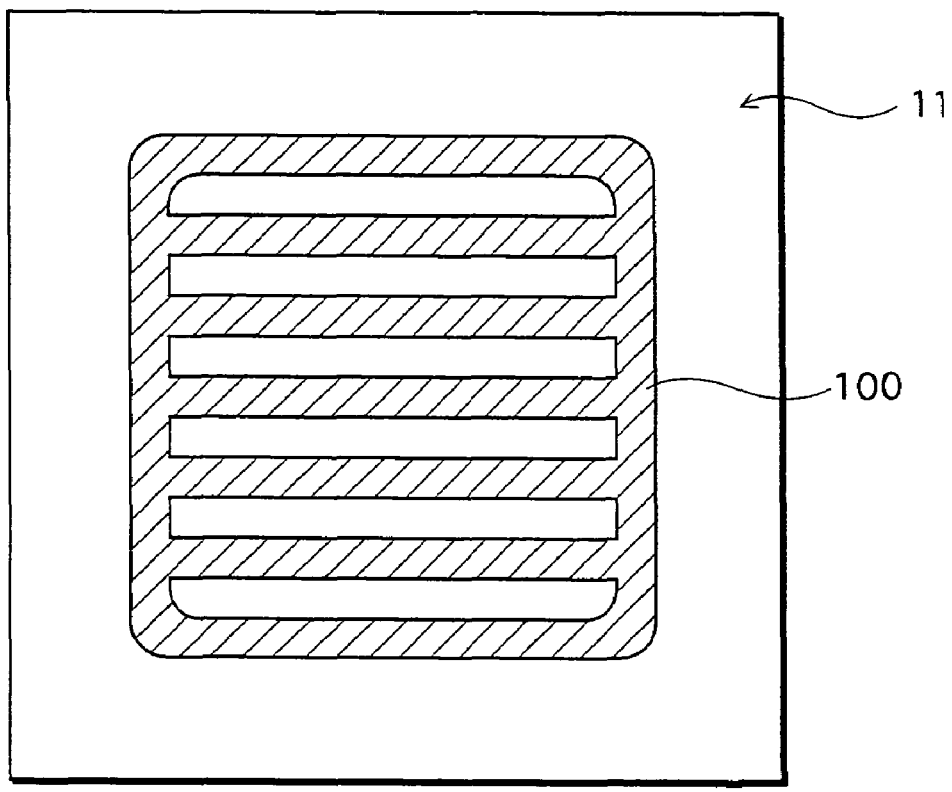
FIG. 17 illustrates a planar shape of a buried layer of the above-mentioned conventional Schottky barrier diode.

FIG. 17 illustrates a planar shape of the buried layer in the above-mentioned conventional Schottky barrier diode.

As shown in FIG. 17, a buried layer 100 of the above-mentioned conventional Schottky barrier diode is formed as one member, and at the same potential as an anode electrode. On the other hand, the buried layers 13a and 13b in the Schottky barrier diode 1 are separated from each other.

Since the buried layer 13b is completely separated from the buried layer 13a and the guard ring 12 in the Schottky barrier diode 1, the total area of the buried layers 13a and 13b is smaller than the area of the buried layer 100. This reduces a resistance. As a result, the Schottky barrier diode has 1 has a lower forward voltage than the above-mentioned conventional Schottky barrier diode.

In addition, only the guard ring 12 and the buried layer 13a in contact with the guard ring 12 are at the same potential as the anode electrode 14 in the Schottky barrier diode 1. That is to say, the pn-junction region in the n epitaxial layer 11 is smaller than in the above-mentioned conventional Schottky barrier diode. This means a smaller depletion layer formed at a pn-junction region in the Schottky barrier diode 1. As a consequence, a capacitance between the electrodes can be reduced.

(Manufacturing Method of the Schottky Barrier Diode 1)

The following part describes a manufacturing method of the Schottky barrier diode 1.

FIGS. 6 to 12 describe the manufacturing process of the Schottky barrier diode 1 step by step. They are cross-sectional views, and each illustrate a part of the Schottky barrier diode 1 during manufacture.

Figure 6:
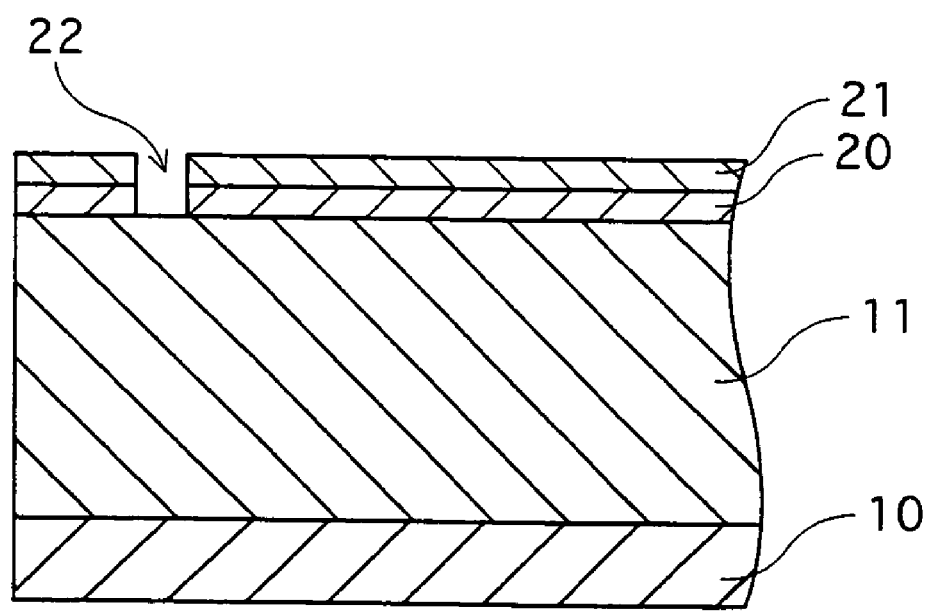
FIG. 6 is a cross-sectional view illustrating a part of the Schottky barrier diode during manufacture.
Figure 7:
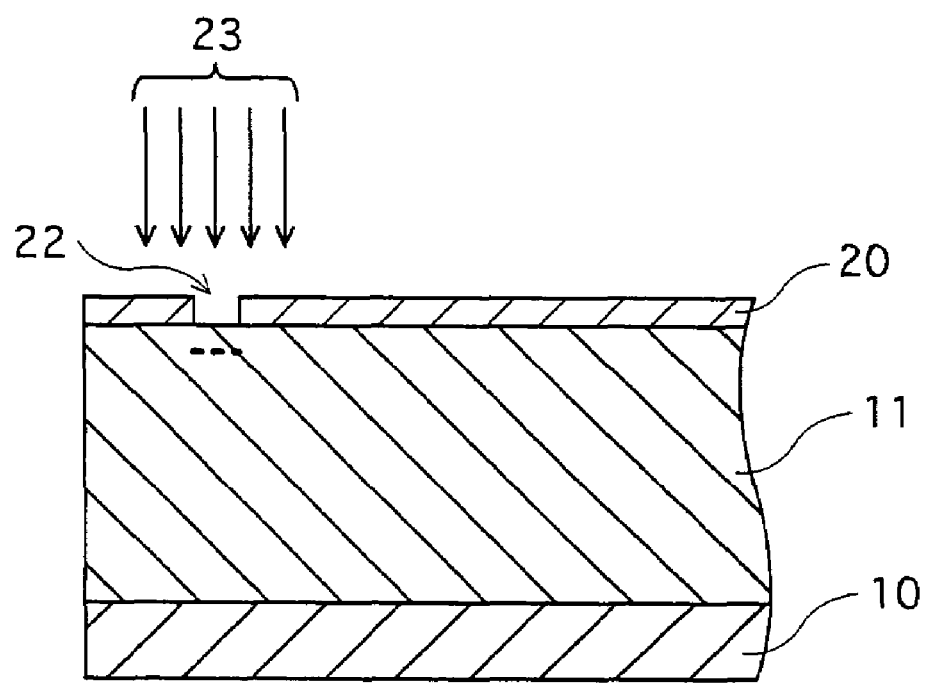
FIG. 7 is a cross-sectional view illustrating a part of the Schottky barrier diode during manufacture.
Figure 8:
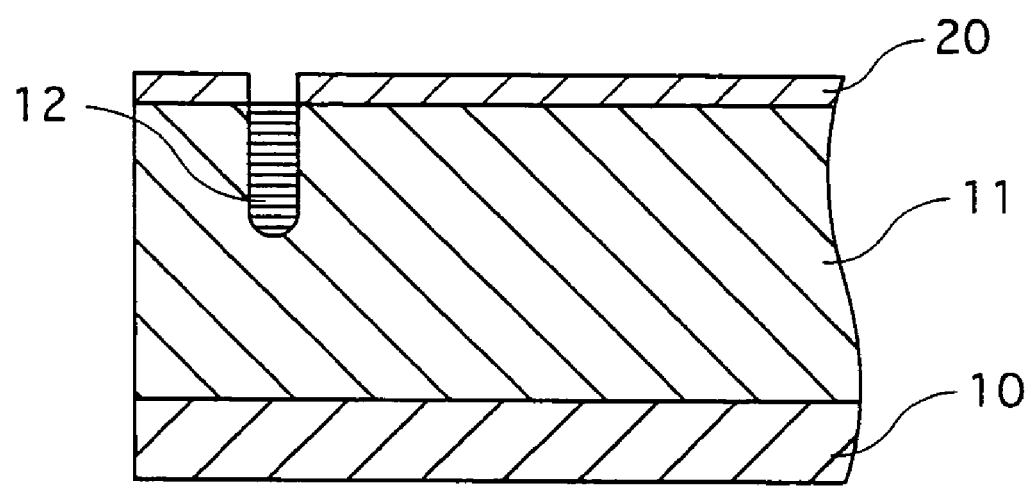
FIG. 8 is a cross-sectional view illustrating a part of the Schottky barrier diode during manufacture.

Firstly, a silicon oxidized film 20 is formed on the n epitaxial layer 11 by thermal oxidation, as shown in FIG. 6. Then, a resist 21 is applied onto the silicon oxidized film 20, and patterned using a photolithography technique. After this, the silicon oxidized film 20 is etched using hydrofluoric acid, to form an opening 22.

After the opening 22 is formed, the resist 21 is removed. Boron ions 23 are then implanted into the opening 22 as impurities to form the guard ring 12 (see FIG. 7).

The result is heated at 1150 degrees centigrade for 20 minutes, in order to activate the implanted boron ions 23 and to diffuse the boron ions 23 deeply enough to function as the guard ring 12. Thus, the guard ring 12 is formed (see FIG. 8).

Figure 9:
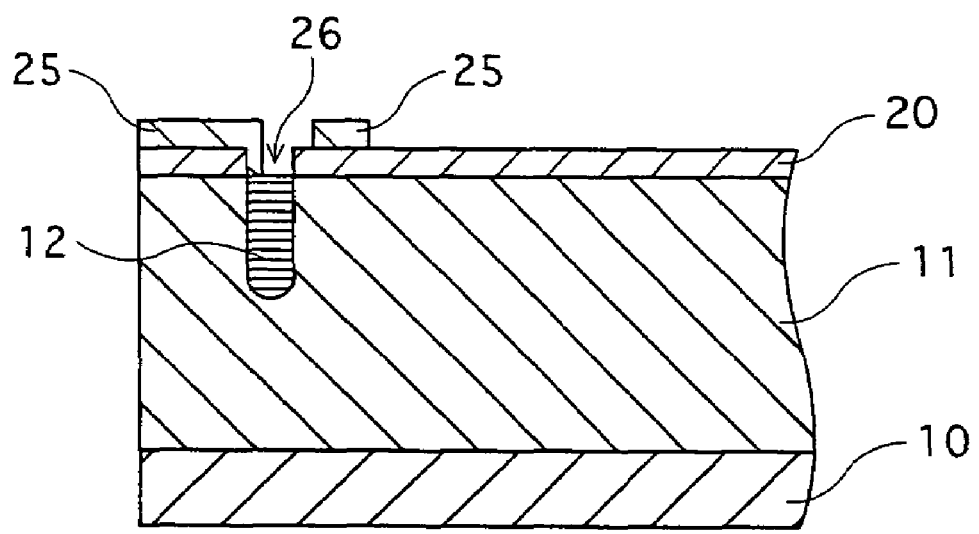
FIG. 9 is a cross-sectional view illustrating a part of the Schottky barrier diode during manufacture.
Figure 10:
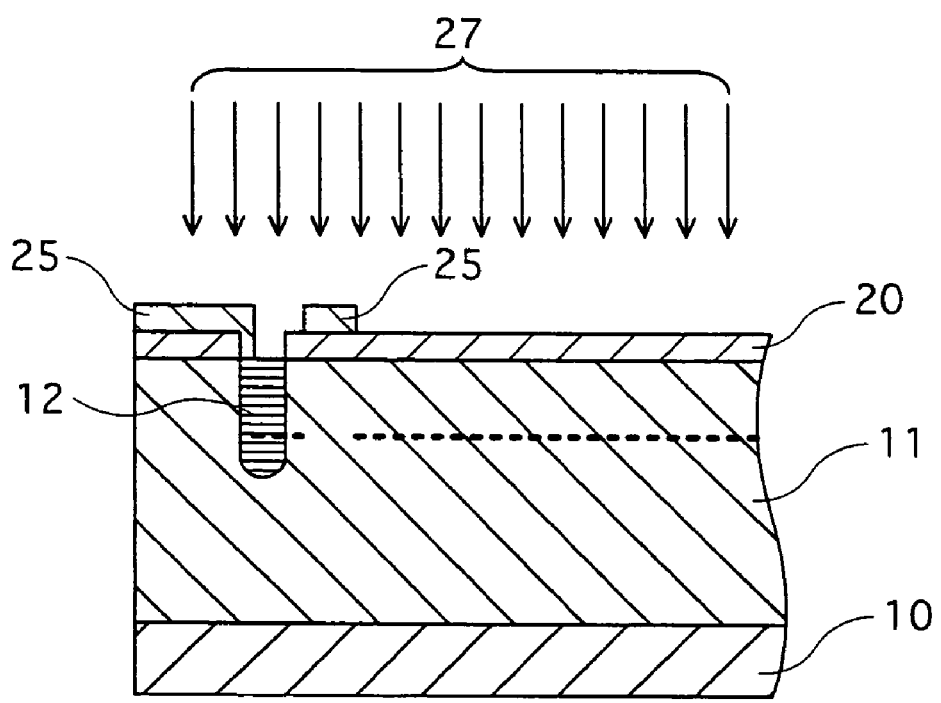
FIG. 10 is a cross-sectional view illustrating a part of the Schottky barrier diode during manufacture.

After this, a resist 25 is applied on to the silicon oxidized film 20, and patterned using a photolithography technique (see FIG. 9).

Boron ions 27 are implanted to form the buried layers 13a and 13b (see FIG. 10), at an accelerating voltage of 1250 keV and with a dose amount of $1 \times 10^{17}$ cm$^2$.

Figure 11:
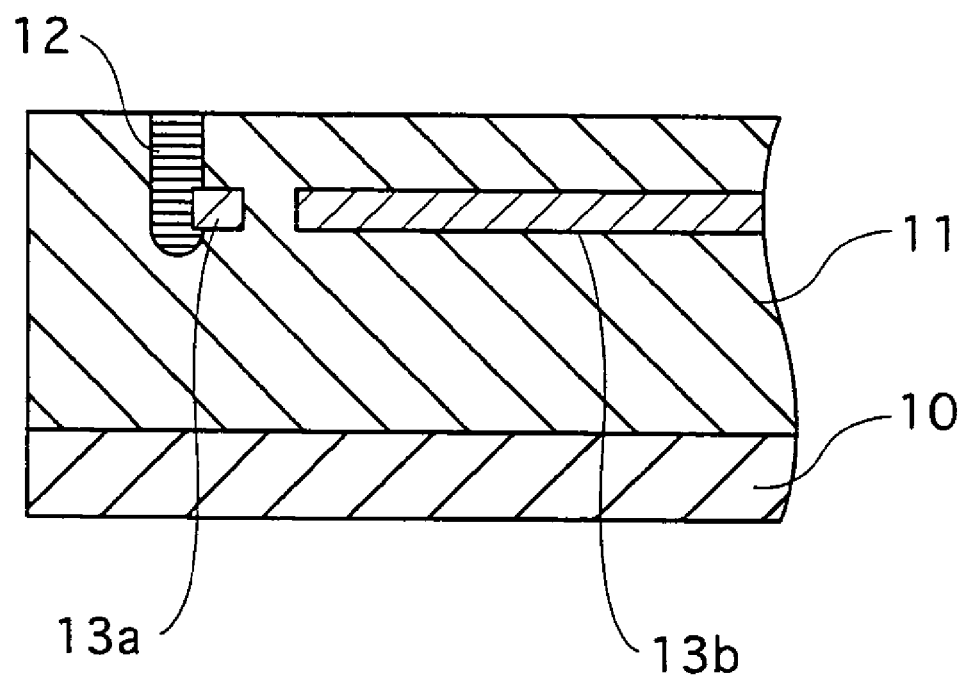
FIG. 11 is a cross-sectional view illustrating a part of the Schottky barrier diode during manufacture.
Figure 12:
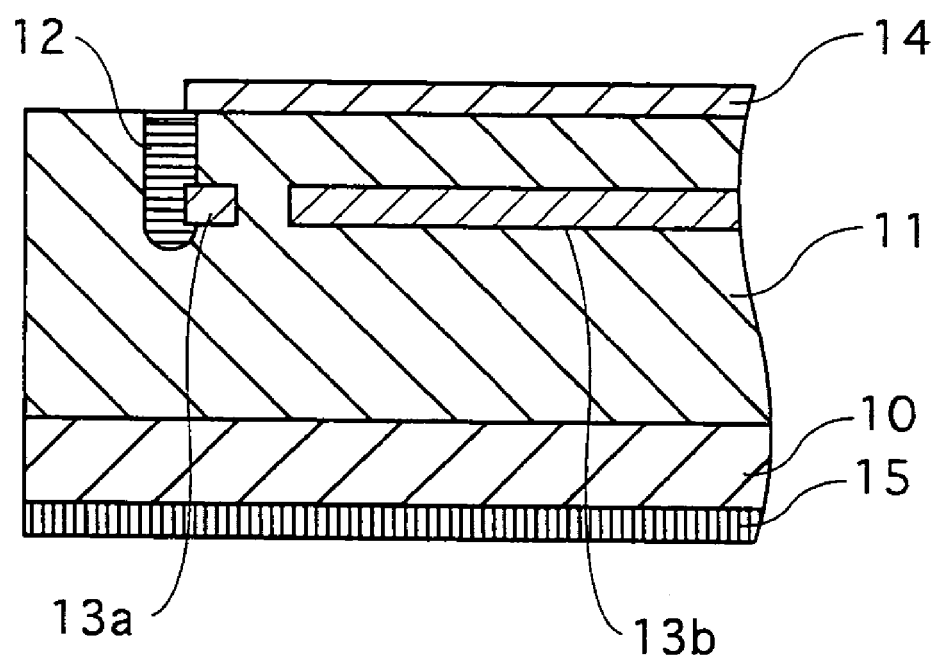
FIG. 12 is a cross-sectional view illustrating a part of the Schottky barrier diode during manufacture.

After this, the resist 25 is removed, and the result is heated at 900 degrees centigrade for 30 minutes to activate the implanted boron ions 27 (see FIG. 11).

By forming the buried layers 13a and 13b at the same time in this way, the precision of the distance between the buried layers 13a and 13b can be improved.

Lastly, Ti and Ag are vapor deposited on the n epitaxial layer 11, to form the anode electrode 14. Also, Ag is vapor deposited on the back surface of the n+ substrate 10, to form the cathode electrode 15 (see FIG. 12).

(Modifications)

A Schottky barrier diode relating to an embodiment of the present invention and a manufacturing method for the same are described in the above part. However, they can be modified without departing from the scope of the present invention. Modification examples are as follows.

(1) According to the above embodiment, the Schottky barrier diode 1 includes both the buried layer 13a and the buried layer 13b. However, the Schottky barrier diode 1 may only include the buried layer 13b.

(2) According to the present embodiment, Si is used as a semiconductor of the Schottky barrier diode 1, but a compound semiconductor such as SiC and GaAs may be instead used. Also, the n+ substrate 10 may be replaced with a p+ substrate. In that case, an n-type semiconductor with a high concentration of impurities is used for the guard ring 12 and the buried layers 13a and 13b.

(3) According to the present embodiment, the anode electrode 14 forming a Schottky contact is made of Ti and Ag. However, the anode electrode 14 may instead be made only of one kind of metal. Other than Ti and Ag, vanadium (V), molybdenum (Mo), lithium (Li), lead (Pb), nickel (Ni), aluminum (Al) and the like are suitable for the anode electrode 14. The cathode electrode 15 forming an ohmic contact is made of Ag, but can be made of any material which is capable of forming an ohmic contact with a substrate.

(4) The present invention is not limited to the shape of the buried layer 13b shown in FIG. 3 described in the above embodiment. For example, the shapes such as those shown in FIGS. 13 to 16 are applicable.

Figure 13:
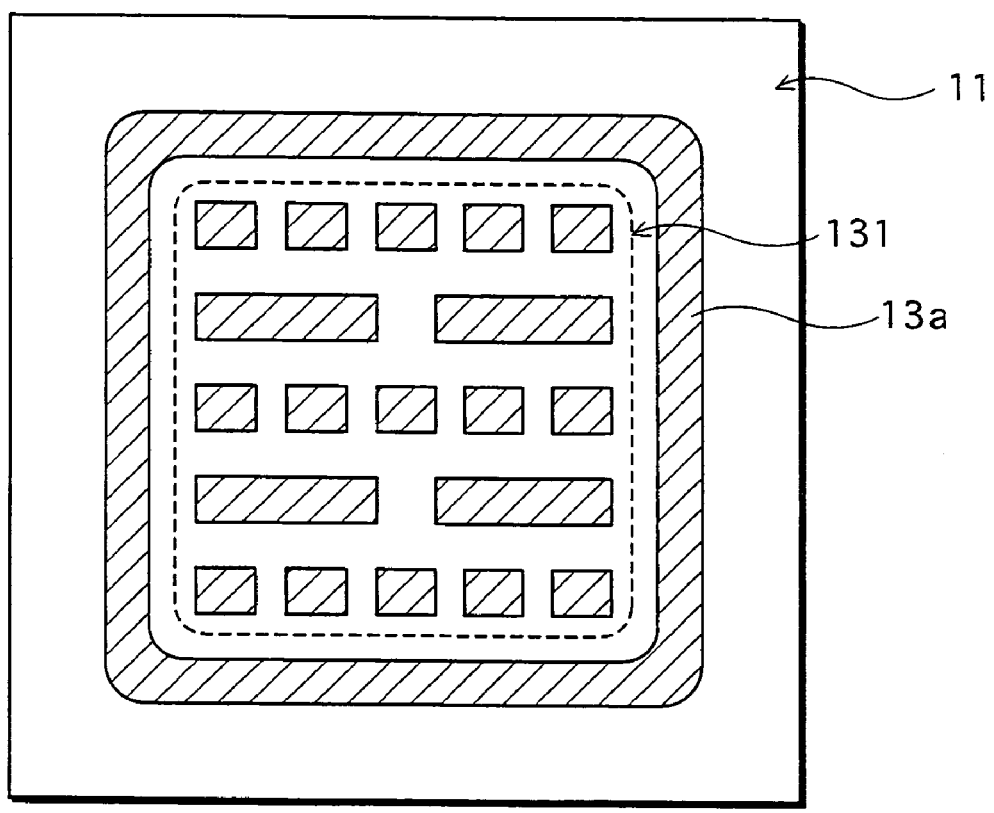
FIG. 13 illustrates a planar shape of a buried layer relating to a modification example 1 and that of a buried layer 13a (shown in FIG. 1)

A buried layer 131 shown in FIG. 13 is formed by dividing each of the strip-shaped members constituting the buried layer 13b shown in FIG. 3 in the following manner. The three strip-shaped members in the middle and at both edges are divided into five portions of the same size, and the remaining two strip-shaped members are divided in half.

Figure 14:
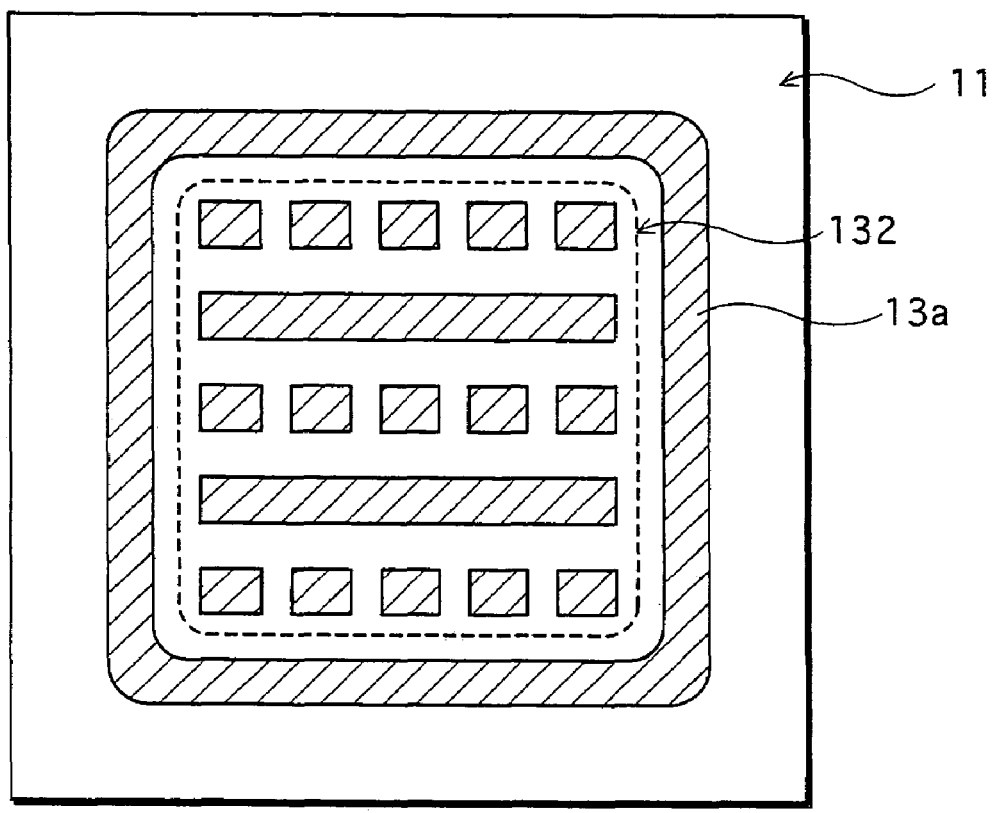

A buried layer 132 shown in FIG. 14 is formed by dividing the three strip-shaped members in the middle and at both edges into five portions of the same size, among the strip-shaped members constituting the buried layer 13b shown in FIG. 3. The remaining two members are left unchanged.

Figure 15:
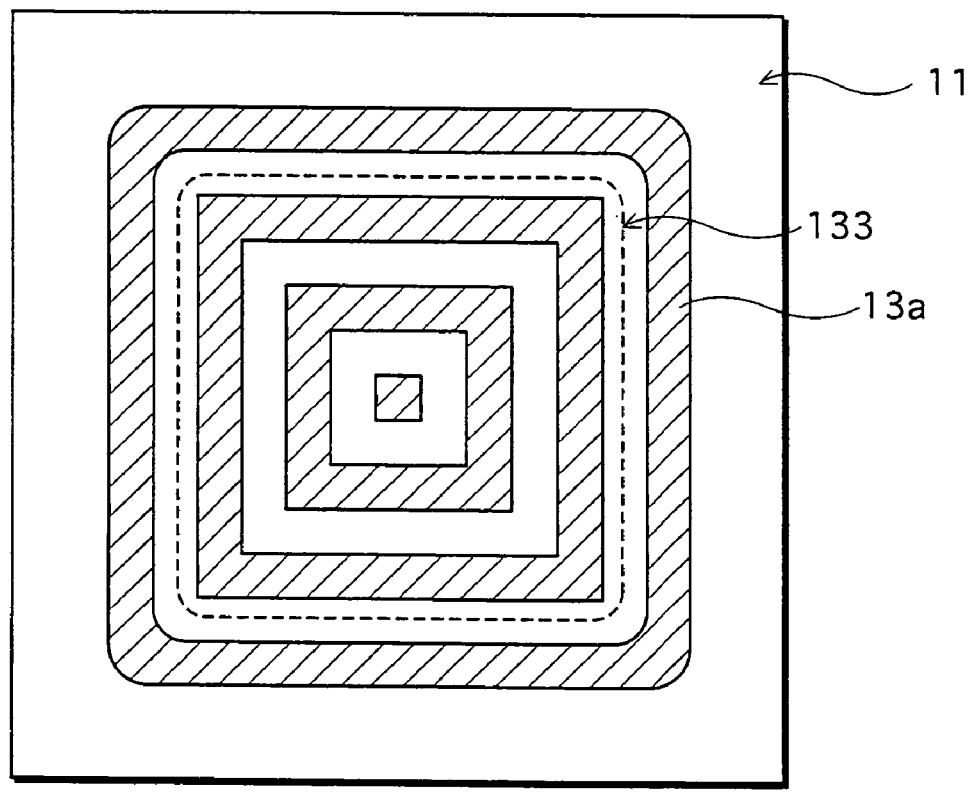

A buried layer 133 shown in FIG. 15 is constituted by one rectangular member in the middle and two ring-like members doubly surrounding the rectangular member.

Figure 16:
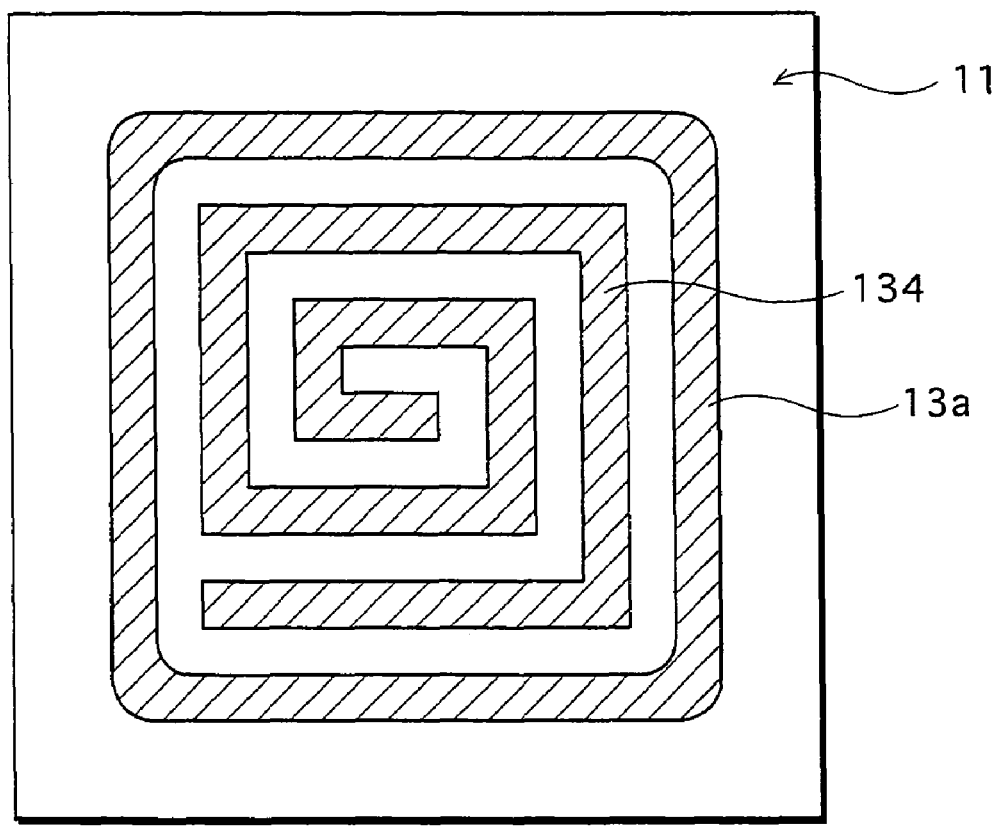

A buried layer 134 shown in FIG. 16 is formed as a spiral. The buried layer 134 may be a right-handed spiral as shown in FIG. 16, or a left-handed spiral. The buried layer 134 may be constituted by a plurality of spirals.

(5) Regarding a manufacturing method for a Schottky barrier diode relating to an embodiment of the present invention, the guard ring and the buried layers are formed using an ion implantation method, but may be formed using a solid-phase diffusion method.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A Schottky barrier diode comprising:
   a semiconductor layer of a first conductivity type;
   a first electrode which is a metal layer forming a Schottky contact with a main surface of the semiconductor layer;
   a second electrode forming an ohmic contact with an opposite main surface of the semiconductor layer;
   a buried layer of a second conductivity type formed within the semiconductor layer so as not to be in contact with the first electrode, the second conductivity type having a different charge carrier from the first conductivity type; and
   a guard ring of the second conductivity type formed within the semiconductor layer so as to be in contact with the first electrode and also to surround the buried layer without contacting with the buried layer.

2. The Schottky barrier diode of claim 1, wherein
   a first depletion layer is formed at an interface region between the guard ring and the semiconductor layer, and a second depletion layer is formed at an interface region between the buried layer and the semiconductor layer; and
   the first depletion layer connects with the second depletion layer, when a reverse bias is applied.

3. The Schottky barrier diode of claim 2, wherein
   the buried layer is constituted by a plurality of members which are separated from each other.

4. The Schottky barrier diode of claim 3, wherein
   the plurality of members are strip-shaped, and arranged at substantially even intervals, so as to be adjacent to each other in a direction perpendicular to a lengthwise direction of the members.

5. The Schottky barrier diode of claim 4, wherein
   the semiconductor layer includes a substrate having a high concentration of impurities and an epitaxial layer having a low concentration of impurities, and
   the guard ring and the buried layer are each made of a semiconductor of the second conductivity type having a high concentration of impurities, and are formed within the epitaxial layer.

6. The Schottky barrier diode of claim 5, wherein
   the first conductivity type is an n type, and
   the second conductivity type is a p type.

7. The Schottky barrier diode of claim 1, wherein:
   a second buried layer of the second conductivity type is formed within the semiconductor layer so as to surround the buried layer without contacting with the first electrode and the buried layer; and
   a guard ring of the second conductivity type is formed within the semiconductor layer so as to surround the second buried layer with being in contact with the first electrode and the second buried layer.

* * * * *